350-440

XR  4,146,408

United Stat
Nelson

[11]  4,146,408
[45]  Mar. 27, 1979

[54] ASPHERICAL SOLAR CELL CONCENTRATOR

[75] Inventor: Richard B. Nelson, Los Altos Hills, Calif.

[73] Assignee: Varian Associates, Inc., Palo Alto, Calif. 94303

[21] Appl. No.: 863,757

[22] Filed: Dec. 23, 1977

[51] Int. Cl.² .......................................... H01L 31/04
[52] U.S. Cl. ............................. 136/89 PC; 350/197; 350/288; 350/293; 350/294
[58] Field of Search ............... 350/288, 293, 294, 197, 350/211; 136/89 PC, 206; 126/270, 271

[56] References Cited

U.S. PATENT DOCUMENTS

| | | | |
|---|---|---|---|
| 3,162,766 | 12/1964 | Ploke | 250/229 |
| 3,189,744 | 6/1965 | Ogland | 250/199 |
| 3,196,366 | 7/1965 | Simpson | 331/94.5 |
| 3,406,404 | 10/1968 | Maier | 343/915 |
| 3,848,970 | 11/1974 | Goodell | 350/189 |
| 3,902,794 | 9/1975 | Abrams | 350/294 |
| 3,998,206 | 12/1976 | Jahn | 126/271 |

OTHER PUBLICATIONS

J. I. Davis, "Solar Cell R & D", *Space Aeronautics*, Apr. 1959, pp. 44–46.

*Primary Examiner*—Aaron Weisstuch
*Attorney, Agent, or Firm*—Stanley Z. Cole; Robert K. Stoddard

[57]  ABSTRACT

A light concentrator for use with photovoltaic cells has a novel aspherical shape to provide the desired distribution of energy over the surface of the cell. The cell is usually circular with a current-collecting bus electrode around the circumference of the active surface. To provide for minimum resistive losses due to the current generated in the cell and flowing to the bus, the light may be concentrated in a band just inside the bus with reduced or even zero energy density inside the band. This distribution is obtained by making the ray-deflecting surface of the concentrator as a figure of revolution whose generating line focuses incident rays arriving parallel to the axis of revolution onto a point removed from the axis. Thus, a point source at infinity is "focused" into a circle around the axis instead of the point focus of conventional optics. Solar light is "focused" into an annular ring. Since the concentrated light pattern is larger than the true image formed by conventional optics with the same focal length, for a given size of cell the focal length can be made shorter and hence the accuracy tolerance of the concentrator surface is greatly relaxed, providing a reduction of cost.

5 Claims, 5 Drawing Figures

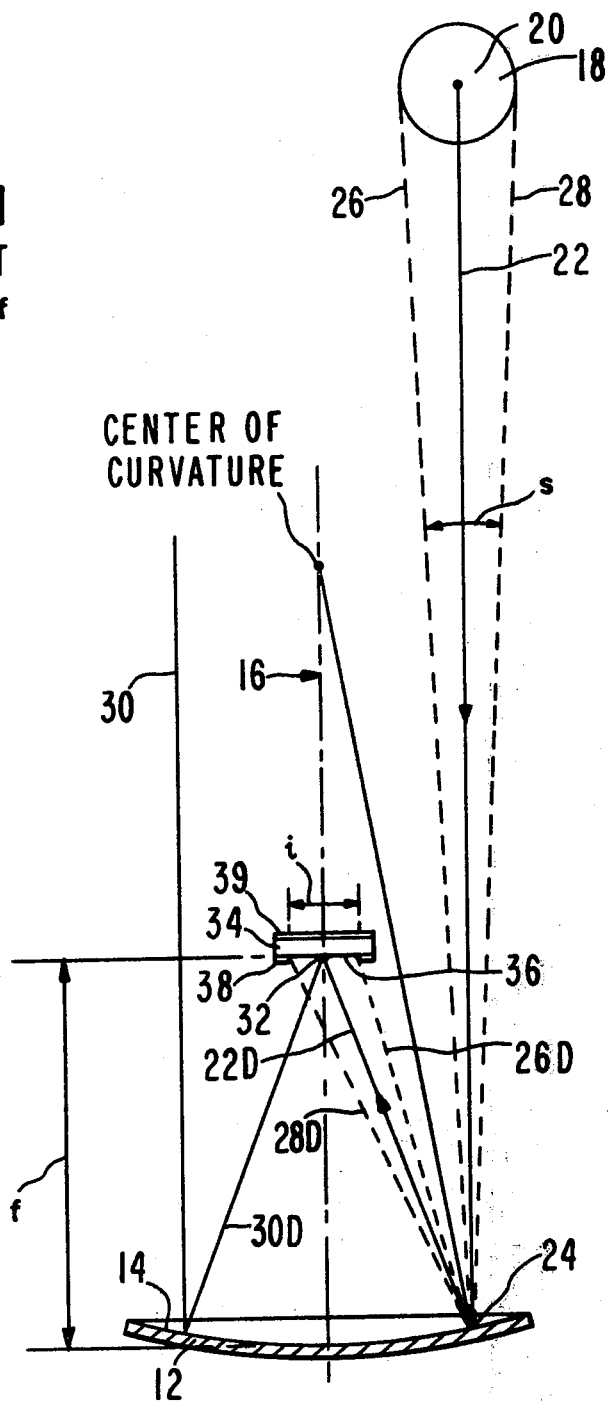

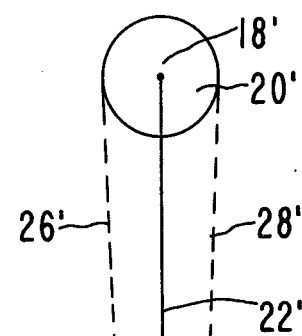
FIG.3
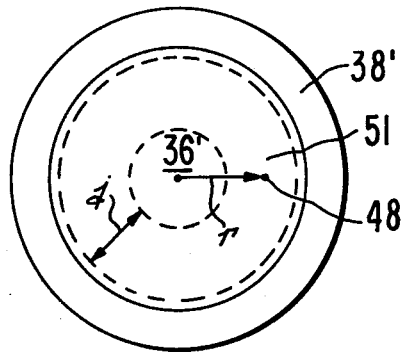
FIG.2
$d=0.1f'$
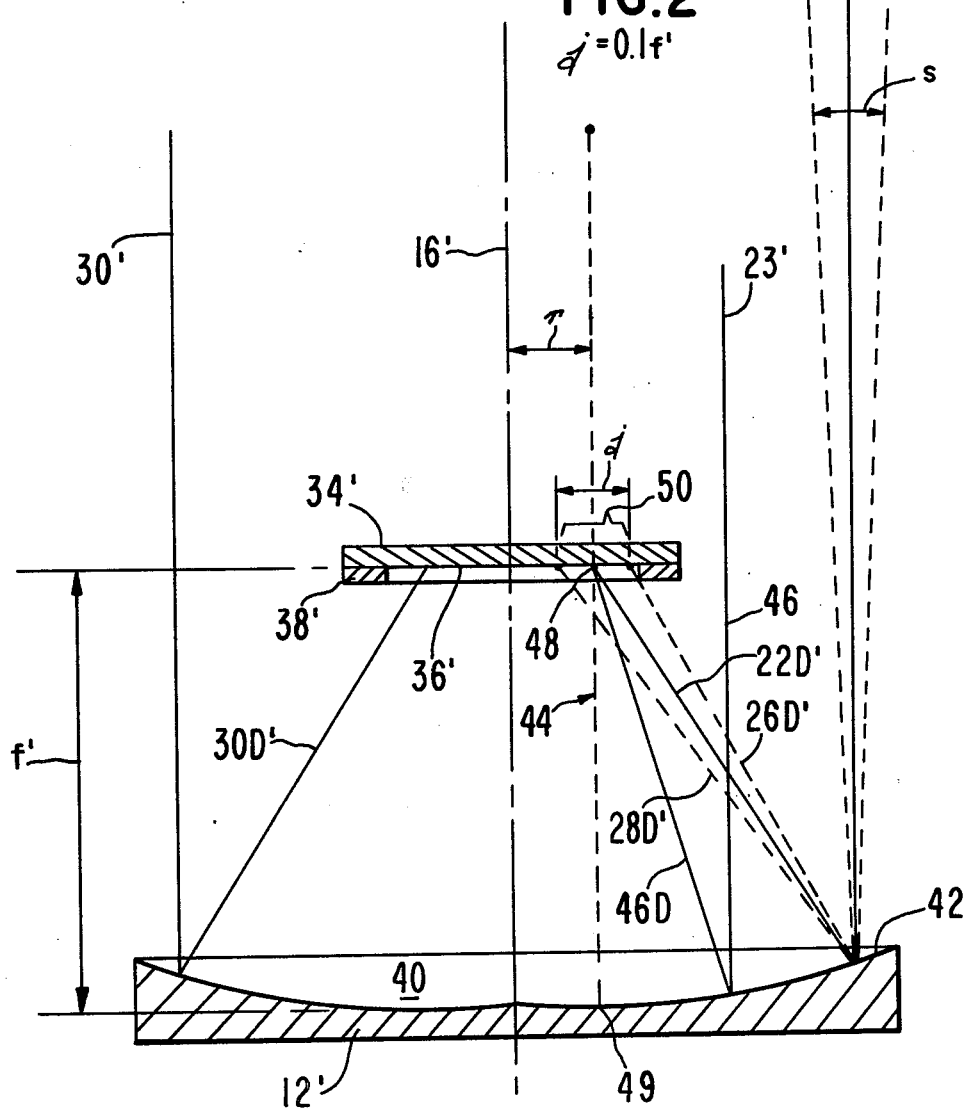

ASPHERICAL SOLAR CELL CONCENTRATOR

FIELD OF THE INVENTION

The invention relates to the use of photovoltaic cells in converting solar energy to electricity. The cells themselves are very expensive, so the use of a concentrator to focus the light arriving over a large area onto a relatively small photovoltaic cell offers considerable saving in cost.

DESCRIPTION OF THE PRIOR ART

Various arrangements have been proposed and used for concentrating solar energy, both for driving photovoltaic cells and for the utilization of heat. U.S. Pat. No. 3,999,283 issued Dec. 28, 1976 to R. H. Dean, et. al., describes lenses and reflectors used in conjunction with flat surface photovoltaic cells. U.S. Pat. No. 3,130,084 issued Apr. 21, 1964 to S. J. Loring describes a paraboloidal reflector for use with a thermal electric generator. U.S. Pat. application No. 666,273 filed Mar. 13, 1976, now abandoned, and application No. 807,937 filed June 17, 1977, now U.S. Pat. No. 4,115,149, both by Ronald L. Bell, describe the use of spherical optical surfaces as concentrators for photovoltaic cells. Bell found that spherical aberrations of the concentrator could, with proper dimensions, be made to give a desirable non-uniform illumination pattern of the cell surface and also that the non-focused illuminated area of the cell could be much larger than a true image of the sun exactly focused by a concentrator of the same focal length. This allowed a reduction in the accuracy of the concentrator surfaces. In Bell's arrangement, the distribution of illumination had to be used as it naturally occurred from the selected spherical concentrator and the illumination pattern changed rapidly with variation of the physical dimensions.

SUMMARY OF THE INVENTION

An objective of the invention is to provide an optical concentrator which will form an optimum radial distribution of received energy.

A further objective is to provide a concentrator which will provide an annular concentration of energy from parallel incident rays, as from a source at an infinite distance.

A further objective is to provide a concentrator which will deflect rays received from the sun into an annular illumination pattern.

A further objective is to provide a photovoltaic cell in conjunction with the concentrator so that instant energy is preferentially concentrated near the periphery of the cell where it is near a peripheral electrode bus for carrying off the generated current with minimum resistive losses.

A further objective is to provide a concentrator which may be placed close to the cell and still have the concentrated light cover an extended area on the cell, so that accuracy of the concentrator surfaces may be relaxed.

These objectives are achieved by making a ray-deflecting surface of the concentrator as a figure of revolution about an axis which is to be pointed at the light source. The intersection of this surface of revolution with a plane containing the axis is a line shaped to deflect incident rays lying in the plane and parallel to the axis onto a focal point which is not on the axis. Thus, the entire deflecting surface concentrates incident rays parallel to the axis into a circle about the axis instead of into a point such as would be the case for conventional aberration-free optical systems.

Light from the extended disc of the sun is thus concentrated into an annular band which can be received by an area of the cell just inside a annular current-collecting bus electrode.

If it is desired to provide equal or reduced illumination on areas of the cell inside this annular band, a second portion of the surface of revolution can be shaped to deflect light into a circle of smaller radius. By combining several such sections, almost any desired radial distribution of illumination can be obtained.

The illumination is distributed over an area much larger than a truly focused image of the sun produced by a concentrator of equivalent focal length. Thus, for a given size of cell, the focal length of the concentrator can be much less than for a conventional true image. For a given size of the illuminated area, the allowable deviations of the deflecting surface from its ideal shape are inversely proportional to the focal length and hence the tolerances of the deflector can be greatly relaxed with consequent decrease in cost.

BRIEF DESCRIPTION OF THE FIGURES

FIG. 1 is a schematic diagram of a solar energy reflecting concentrator as used in the prior art.

FIG. 2 is a schematic cross section of a reflecting concentrator according to the present invention.

FIG. 3 is a plan view of the face of the solar cell of FIG. 2.

DESCRIPTION OF THE PREFERRED EMBODIMENTS

Figure 5:
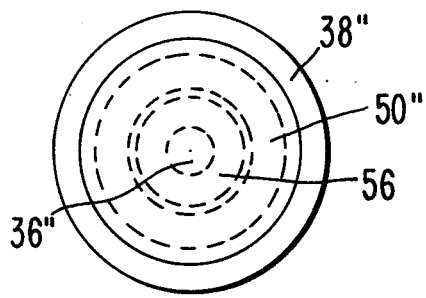
FIG. 5 is a plan view of the illuminated areas of the photovoltaic cell of FIG. 4.

FIG. 1 ilustrates a typical prior-art solar energy converter using a reflector for concentrating energy on a photovoltaic cell. The concentrator 12 has a top reflecting surface 14 which is typically a section of a sphere but which may be corrected to a paraboloid for more perfect imaging of an object at infinity such as the sun. The central axis 16 of reflector 14 is pointed at the source of energy, typically the sun 18. Sun 18 is illustrated here displaced from axis 16 for clarity. Of course, from a point at an infinite distance all light rays arrive parallel so the sketched lateral displacement is simply a device to illustrate the rays in a small sketch. From the center 20 of sun 18 a ray 22 parallel to the axis 16 strikes reflector 14 at point 24 and is deflected as ray 22D intersecting axis 16 at the focal point 32 of reflector 14, located at a distance f equal to the focal length, from the center of reflecting surface 14. Other parallel rays 30 striking other parts of reflector 14 are reflected as at 30D. If reflector 14 is free of aberrations, as is the case with a perfect paraboloid, all the rays parallel to axis 16 are deflected to meet at focus 32.

The sun, of course, is not a point source, but subtends a solid angle s of approximately 0.01 radians. Rays 26 and 28 from the sun's limbs are deflected by mirror 14 as rays 26D and 28D to form a circular image in the plane of focus 32 having a diameter $i = sf = 0.01f$.

A photovoltaic cell 34 is placed with its active face 36 in the focal plane, centered about the sun's image. A current collecting bus electrode 38 is applied to the active surface 36 as a ring surrounding the illuminated image. A second electrode 39 is affixed to the back side of cell 34. External conductors (not shown) connect to electrodes 38 and 39 for carrying the generated current to its intended load. It is obvious from the simple optics of this prior-art concentrator that the size of the illuminated image is completely controlled by the focal length of the deflector. Thus, for a given size of photovoltaic cell the focal length is determined to make the image cover the available cell surface. The accuracy of the deflecting surface then must be adequate to prevent light from falling outside the active area of the cell.

FIG. 2 is a schematic sectional view similar to FIG. 1 but illustrating a simple embodiment of the invention. The reflecting surface 40 is not a section of a sphere or paraboloid and hence does not form a true image. Surface 40 is a figure of revolution formed by rotating about axis of revolution 16' a curve 42 lyingin a plane containing axis of revolution 16'. Curve 42 is shaped to deflect incident rays such as 22' and 23' lying in its plane and parallel to axis 16', to meet at a point 48 which is removed a distance r from axis 16'. It could thus be said that point 48 is the two-dimensional "focus" of line 42. Line 42 may be a parabola with its focus at point 48 at a focal distance f' from its vertex 49 located on the axis 44 of the parabola which in this illustration is parallel to axis of rotation 16' and a distance r from it. Parabola axis 44 need not be parallel to axis of rotation 16' but may form a small angle with it, in which case the focus of rays parallel to the axis of revolution 16' will be displaced from parabola axis 44. Alternatively, where less precise focusing is allowable, curve 42 may be a sector of a circle whose center is on line 44 and whose radius is 2f'. Rays 26' and 28' from the limbs of the sun are deflected as rays 26D' and 28D' to focus over a radial line 50 of length j in a plane perpendicular to axis 16' and containing focal point 48. Photovoltaic cell 34' is disposed with its active surface 36' in this focal plane. A peripheral bus electrode 38' on the circular front surface has an aperture radius slightly larger than $r + \frac{1}{2}j$ from axis 16' so that all the light deflected from any part of reflector 40 falls in the aperture. For simplicity the back electrode of the photovoltaic cell is not shown. Rays 30' falling on the opposite section of line 42 are deflected as 30D' to concentrate on the opposite side of axis 16'. Since parallel rays in the plane of curve 42 concentrate in the focal plane at point 48 it is clear that the entire reflecting surface 40 will "focus" all rays (in any plane) parallel to axis 16' into a circle of radius r. Also, all rays from the extended surface of the sun will be "focused" into an annular band 51 (FIG. 3) defined by rotating the radial extend 50 about axis 16'.

FIG. 3 is a view looking at the face of cell 34' showing the distribution of illumination. Since all the light falls on annular band 51 quite close to electrode bus 38', the resistance of the cell to current generated and flowing outward to bus 38' is minimized. The diameter $2r + j$ of the illuminated area may be considerably larger than the diameter j of a true image formed by a concentrator of equivalent focal length f'. This means that, for a given size of cell, which determines the usable diameter of illuminated area, the focal length f' may be much shorter than the focal length f (FIG. 1) needed when a true image is focused on the cell. For a given allowable deviation of the dimensions of the illuminated area, the angular inaccuracies in the shape of its surface must be inversely proportional to its focal length. Thus, the concentrator surface according to the invention need be much less accurate than for conventional concentrators and the cost is accordingly greatly reduced.

Figure 4:
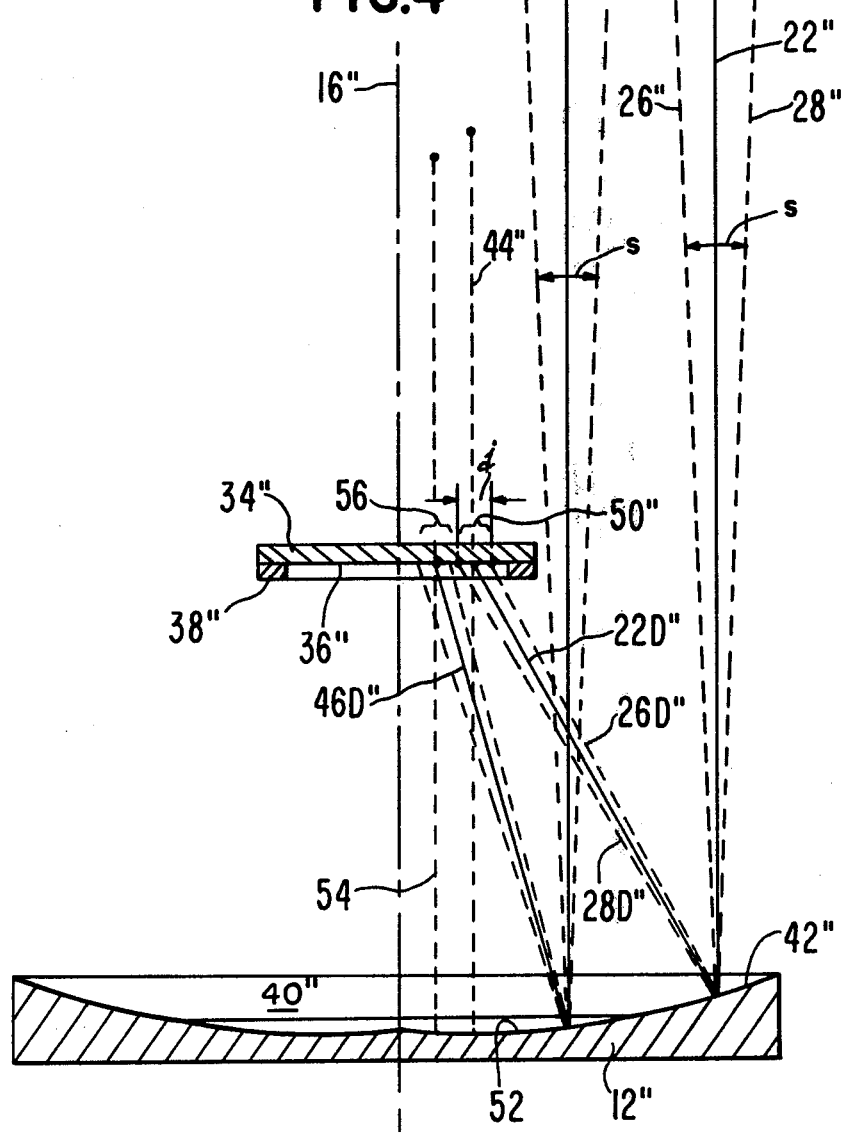
FIG. 4 is a schematic cross section of a reflecting concentrator producing a double annular illuminated area.

FIG. 4 is a schematic sectional view of another embodiment of the invention. The ray-deflecting surface 40" is composed of two concentric zones. Each zone is formed by rotating a section of the generator curve about the common axis 16". The outer section 42" of the generator curve is a section of a parabola with axis 44" displaced from axis of rotation 16". As before, ray 22" incident parallel to axis of rotation 16" is deflected as ray 22D" to strike the photovoltaic cell surface 36" at its intersection with parabola axis 44". Similarly, rays 26" and 28" from the limbs of the sun 20" are deflected as 26D" and 28D" to fall on cell 36" over a radial extent 50". The inner portion 52 of the generator curve is a second parabola with axis 54 displaced from axis of rotation 16" by a smaller amount than axis 44" of the outer parabola 42". Thus, rays incident on the inner zone fall on a radial extent 56 of cell surface 36" which is arranged to be just inside the extent 50" of the intercepted rays from the outer zone.

FIG. 5 is a plan view of the photovoltaic cell of FIG. 4 to show the resulting concentric illuminated annular zones 50" and 56 of the cell's active surface 36". Zone 50" is just inside the current collector electrode bus 38" to minimize resistance losses. It is obvious that other annular zones can be added if desired to illuminate more of active surface 36". Also an auxiliary, central current collecting electrode may be added inside the smallest illuminated zone to further reduce the resistance losses. The intensity of illumination in each annular zone is proportional to the area of its ray-deflecting surface divided by its average circumference. Thus, the total ray deflecting area can be divided into zones whose area is chosen to produce any desired distribution of illumination on cell 36". For example, zone 50" nearest collecting electrode 38" might be illuminated with the maximum intensity permitted by the photovoltaic cell surface and inner zone 56 may have a lower intensity consistent with the longer path its generated current must take to reach collector 38". The radial sequence of the illuminated annular zones need not be the same as that of the ray-deflecting zones, that is the deflected paths may cross each other if desired.

The examples described above are illustrative of simple embodiments of the invention. However, it will be obvious to one skilled in the art that many alternative embodiments may be used. The ray-deflecting surface may of course be a refracting surface rather than a reflecting surface. The relative production and maintenance costs of various kinds of concentrators are not now well determined for the large number of units which would be required for an operating power plant. A refracting surface might be either a simple lens or a Fresnel lens. The surface may be shaped to form a perfect "image," such as the described mirrors generated by parabolas, or the equivalent aspherical refracting surfaces. Alternately, aspherical surfaces formed by rotating sections of circles about axes removed from their centers may produce an adequate quality of image at somewhat reduced cost. The scope of the invention is intended to be limited only by the following claims and their legal equivalents.

I claim:
1. Photovoltaic cell apparatus comprising an aspherical optical concentrator, a photovoltaic cell, and means for positioning said cell and said concentrator, said concentrator comprising at least one ray-deflecting surface which is a portion of a figure of revolution about an axis, a substantial portion of said concentrator being shaped such that incident rays parallel to said axis in a plane containing said axis which strike said deflecting surface over a substantial extent are focused at a focal point in said plane removed from said axis, said cell having an active surface positioned near said focal point and facing said concentrator, said active surface extending radially from said axis at least as far as the radius from said axis to said focal point.

2. The concentrator of claim 1 wherein said active surface is approximately perpendicular to said axis.

3. The concentrator of claim 1 further including an electrical contact on the surface of said cell facing said concentrator disposed on the periphery of said active surface.

4. The concentrator of claim 3 wherein said contact substantially surrounds said active surface.

5. The concentrator of claim 1 wherein said active surface has a circular outer boundary.

* * * * *